US012559843B2

(12) United States Patent　(10) Patent No.:　US 12,559,843 B2

Nakashima et al.　(45) Date of Patent:　Feb. 24, 2026

(54) SUBSTRATE PROCESSING APPARATUS, METHOD OF MANUFACTURING SEMICONDUCTOR DEVICE, METHOD OF PROCESSING SUBSTRATE, AND RECORDING MEDIUM FOR SUPPRESSING OVERHEATING OF A PIPE HEATER

(71) Applicant: Kokusai Electric Corporation, Tokyo (JP)

(72) Inventors: Satoshi Nakashima, Toyama (JP); Koji Shibuya, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 759 days.

(21) Appl. No.: 17/849,993

(22) Filed: Jun. 27, 2022

(65) Prior Publication Data

US 2022/0325414 A1　Oct. 13, 2022

Related U.S. Application Data

(63) Continuation of application No. PCT/JP2021/002599, filed on Jan. 26, 2021.

(30) Foreign Application Priority Data

Mar. 4, 2020　(JP) ................................. 2020-036906

(51) Int. Cl.
*C23C 16/455*　(2006.01)
*C23C 16/44*　(2006.01)
(Continued)

(52) U.S. Cl.
CPC .......... *C23C 16/52* (2013.01); *C23C 16/4412* (2013.01); *C23C 16/455* (2013.01);
(Continued)

(58) Field of Classification Search
None
See application file for complete search history.

(56) References Cited

U.S. PATENT DOCUMENTS 9,581,996 B2 * 2/2017 Asai ................... G05B 23/0235
9,895,727 B2 2/2018 Nakamura et al.
(Continued)

FOREIGN PATENT DOCUMENTS

JP　　　11-074066 A　　3/1999
JP　　2007-088394 A　　4/2007
(Continued)

OTHER PUBLICATIONS

Korean Office Action issued on Jan. 22, 2024 for Korean Patent Application No. 10-2022-7022046.
(Continued)

*Primary Examiner* — Binu Thomas
(74) *Attorney, Agent, or Firm* — Volpe Koenig

(57)　　　　　ABSTRACT

There is provided a technique including: at least one pipe heater configured to heat at least one gas pipe configured to supply a gas to a process chamber in which a substrate is processed; at least one temperature detector configured to detect a temperature of the at least one gas pipe; at least one temperature controller configured to be capable of, based on the temperature detected by the at least one temperature detector, outputting a manipulated variable indicating electric power to be supplied to the at least one pipe heater, and controlling the temperature of the at least one gas pipe to approach at least one desired setpoint; and a host controller configured to be capable of controlling start and stop of heating of the at least one gas pipe performed under the control of the at least one temperature controller.

16 Claims, 7 Drawing Sheets

(51) Int. Cl.

| | | |
|---|---|---|
| *C23C 16/52* | (2006.01) | |
| *H01L 21/02* | (2006.01) | |
| *H01L 21/67* | (2006.01) | |
| *H05B 1/02* | (2006.01) | |

(52) U.S. Cl.

CPC .... *C23C 16/45561* (2013.01); *H01L 21/0217* (2013.01); *H01L 21/02211* (2013.01); *H01L 21/02271* (2013.01); *H01L 21/67103* (2013.01); *H01L 21/67248* (2013.01); *H05B 1/0233* (2013.01); *C23C 16/4557* (2013.01)

(56) References Cited

U.S. PATENT DOCUMENTS

| | | | | |
|---|---|---|---|---|
| 2008/0213716 A1* | 9/2008 | Koyama | ........... | H01L 21/67109 |
| | | | | 432/120 |
| 2012/0270169 A1* | 10/2012 | Yamaga | ........... | H01L 21/67248 |
| | | | | 374/117 |
| 2016/0281224 A1* | 9/2016 | Harada | ............. | C23C 16/45546 |
| 2017/0107620 A1* | 4/2017 | Sugiura | ............. | H01L 21/67017 |
| 2018/0087709 A1* | 3/2018 | Ohno | ................ | C23C 16/45561 |
| 2018/0120822 A1* | 5/2018 | Asai | .................. | C23C 16/45523 |
| 2018/0204720 A1* | 7/2018 | Tanaka | ............. | C23C 16/45561 |

FOREIGN PATENT DOCUMENTS

| | | |
|---|---|---|
| JP | 2010-245218 A | 10/2010 |
| JP | 2011-061002 A | 3/2011 |
| JP | 2018-078271 A | 5/2018 |
| JP | 2018-113115 A | 7/2018 |

OTHER PUBLICATIONS

International Search Report, PCT/JP2021/002599, Mar. 30, 2021, 5 pgs.

* cited by examiner

FIG. 3

Start

↓

Substrate loading step    〜 S102

↓

Film-forming step    〜 S104

↓

Substrate unloading step    〜 S106

↓

End

FIG. 6

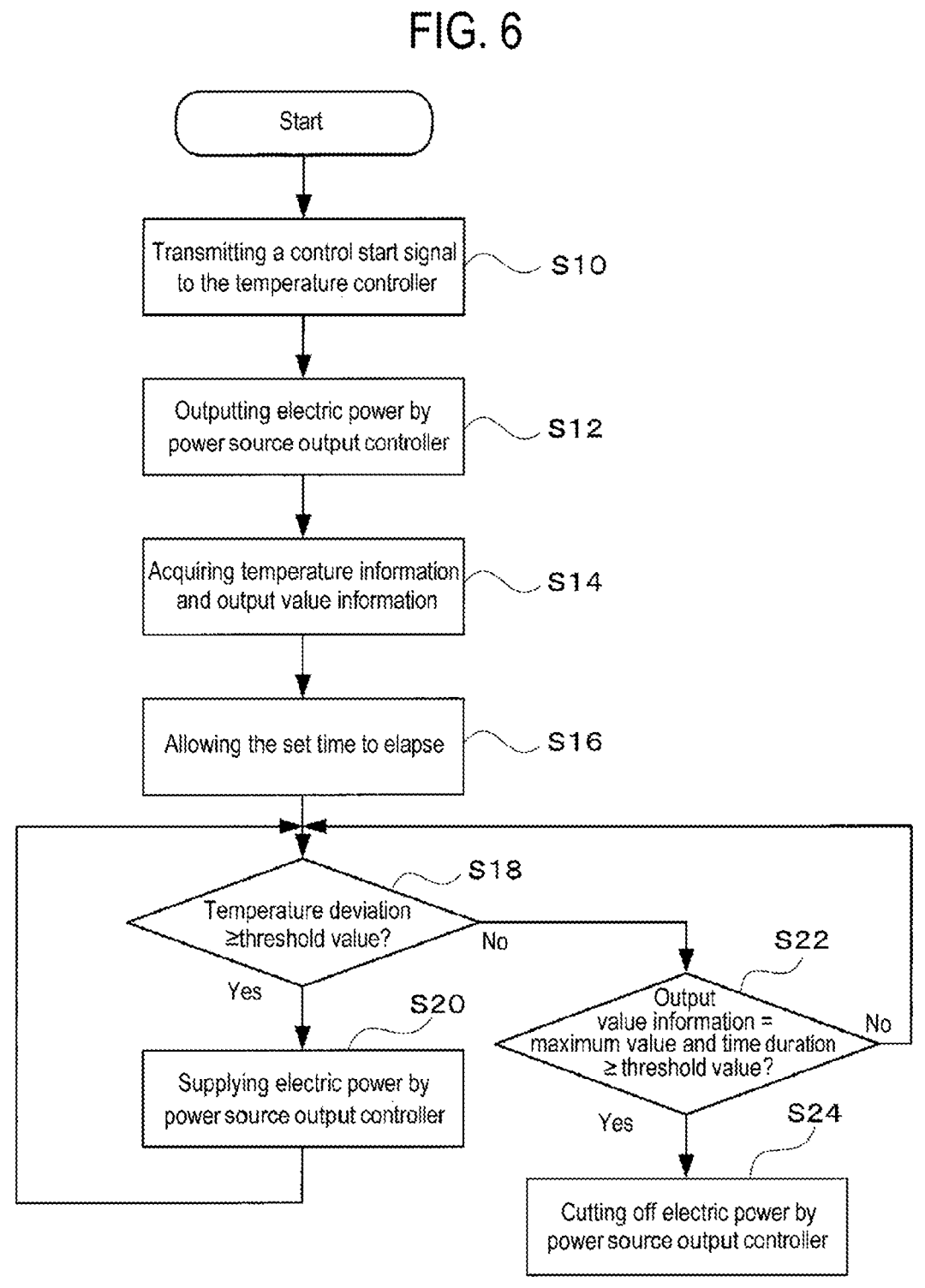

```
                    ┌─────────────┐
                    │    Start    │
                    └──────┬──────┘
                           │
                           ▼
        ┌──────────────────────────────────┐
        │ Transmitting a control start signal│  ─── S10
        │   to the temperature controller    │
        └──────────────────┬─────────────────┘
                           │
                           ▼
        ┌──────────────────────────────────┐
        │   Outputting electric power by    │  ─── S12
        │  power source output controller   │
        └──────────────────┬─────────────────┘
                           │
                           ▼
        ┌──────────────────────────────────┐
        │ Acquiring temperature information │  ─── S14
        │   and output value information    │
        └──────────────────┬─────────────────┘
                           │
                           ▼
        ┌──────────────────────────────────┐
        │   Allowing the set time to elapse │  ─── S16
        └──────────────────┬─────────────────┘
```

S18 — Temperature deviation ≥threshold value?

No

S22 — Output value information = maximum value and time duration ≥ threshold value?

No

Yes

S20 — Supplying electric power by power source output controller

Yes

S24 — Cutting off electric power by power source output controller

SUBSTRATE PROCESSING APPARATUS, METHOD OF MANUFACTURING SEMICONDUCTOR DEVICE, METHOD OF PROCESSING SUBSTRATE, AND RECORDING MEDIUM FOR SUPPRESSING OVERHEATING OF A PIPE HEATER

CROSS-REFERENCE TO RELATED APPLICATION

This application is a Bypass Continuation application of PCT International Application No. PCT/JP2021/002599, filed on Jan. 26, 2021, the disclosure of which is incorporated herein in its entirety by reference.

TECHNICAL FIELD

The present disclosure relates to a substrate processing apparatus, a method of manufacturing a semiconductor device, a method of processing a substrate, and a recording medium.

BACKGROUND

As a process of manufacturing a semiconductor device, a process of forming a film on a substrate while controlling a temperature inside a furnace by controlling a value of electrode power supplied to a heater based on the measured temperature of a temperature sensor installed in the furnace may be performed. Further, a technique that enables stable continuation of temperature control in the furnace even when the temperature sensor fails may be used in the related art.

Further, a process of forming a film on a substrate may be performed while heating a gas pipe wound with a tape-shaped or ribbon-shaped pipe heater. At this time, the temperature is monitored by using a temperature sensor such as a thermocouple (TC) or the like to detect the temperature of the gas pipe.

When the thermocouple is kept separated from the pipe heater, for example, the thermocouple is installed at the gas pipe, and the pipe heater is wound around the thermocouple to monitor the temperature. In such a case, when a problem such as removal of the thermocouple or the like occurs in the temperature monitoring, an electric power may continue to be supplied to the pipe heater and the pipe heater may be overheated.

The present disclosure provides a technique capable of suppressing overheating of a pipe heater.

SUMMARY

According to embodiments of the present disclosure, there is provided a technique that includes:

at least one pipe heater configured to heat at least one gas pipe configured to supply a gas to a process chamber in which a substrate is processed;

at least one temperature detector configured to detect a temperature of the at least one gas pipe;

at least one temperature controller configured to be capable of, based on the temperature detected by the at least one temperature detector, outputting a manipulated variable indicating electric power to be supplied to the at least one pipe heater, and controlling the temperature of the at least one gas pipe to approach at least one desired setpoint; and a host controller configured to be capable of controlling start and stop of heating of the at least one gas pipe performed under the control of the at least one temperature controller, wherein the host controller is configured to be capable of, after a predetermined waiting time elapses from the start of heating of the at least one gas pipe performed under the control of the at least one temperature controller, acquiring the manipulated variable, integrating a time duration during which the manipulated variable is kept at a maximum value, and controlling the at least one temperature controller to stop heating the at least one gas pipe when the integrated time duration becomes equal to or more than a threshold value.

BRIEF DESCRIPTION OF DRAWINGS

The accompanying drawings, which are incorporated in and constitute a part of the specification, illustrate embodiments of the present disclosure.

FIG. 3 is a flow chart showing a substrate processing process according to embodiments of the present disclosure.

FIG. 6 is a flow chart for explaining an operation of a programmable logic controller (PLC) according to embodiments of the present disclosure.

DETAILED DESCRIPTION

Figure 1:
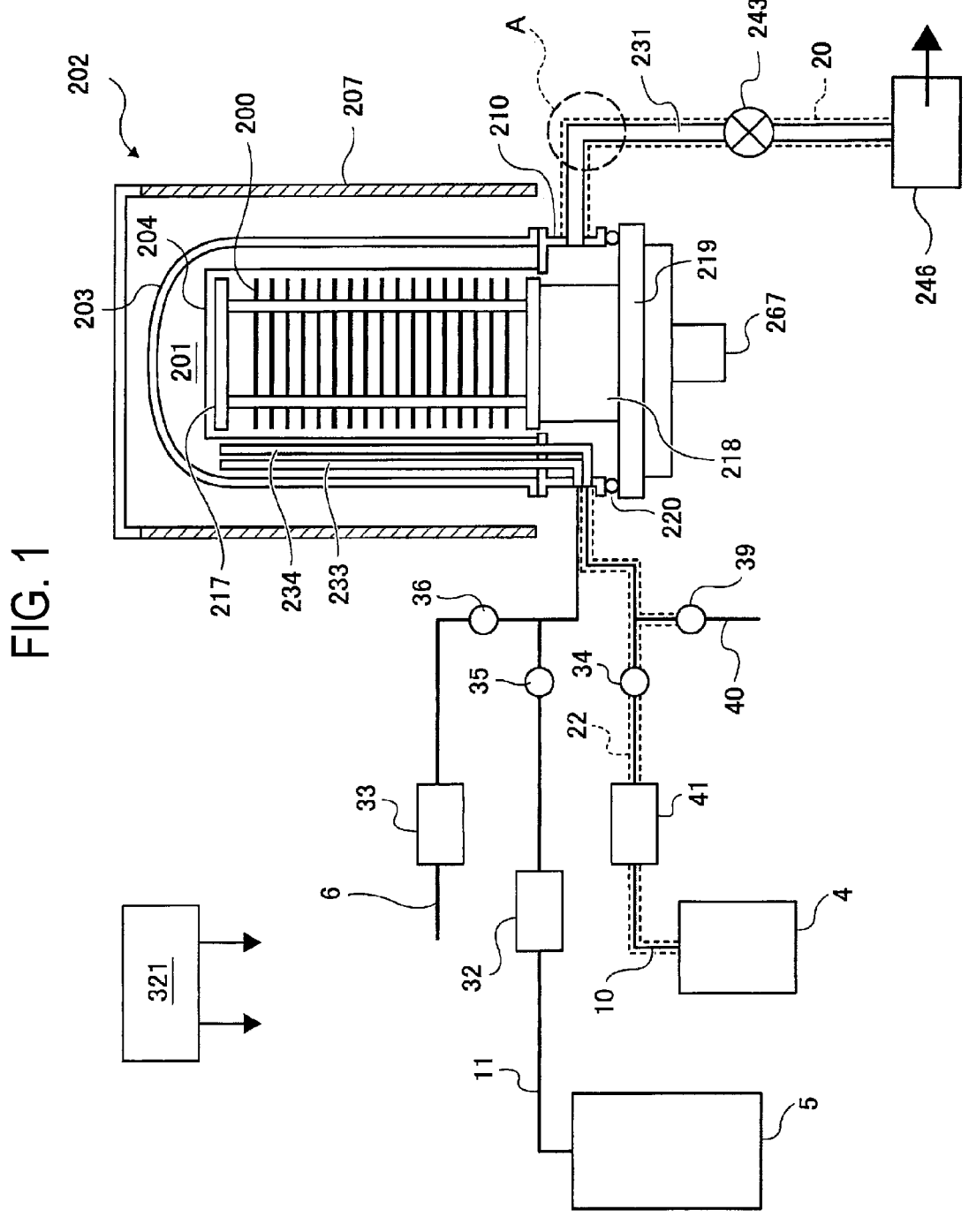
FIG. 1 is a vertical cross-sectional view schematically showing a vertical process furnace of a substrate processing apparatus according to embodiments of the present disclosure.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

(1) Configuration of Substrate Processing Apparatus

Hereinafter, embodiments will be described with reference to the drawings. In the following description, the same components may be designated by like reference numerals and description thereof may be omitted. In addition, the drawings may schematically represent a width, a thickness, a shape, etc. of each component as compared with actual ones to clarify the explanation, but such a representation may be nothing more than an example and does not limit interpretation of the present disclosure.

(Process Furnace)

As shown in FIG. 1, a reaction tube 203 as a process container for processing a wafer 200 as a substrate is provided inside a heater 207 which is a first heater. An inlet flange 210 as a furnace opening is provided at the lower end of the reaction tube 203, and the inlet flange 210 is airtightly closed by a seal cap 219 as a lid via an O-ring 220 as a seal. Further, an inner tube 204 is mounted on the inlet flange 210. A process chamber 201 is formed with at least the reaction tube 203, the inner tube 204, the inlet flange 210, and the seal cap 219. A boat 217, which is a substrate holder, is installed at the seal cap 219 via a quartz cap 218. The quartz cap 218 and the boat 217 are loaded into and unloaded from the process chamber 201. A plurality of wafers 200 to be batch-processed are horizontally loaded on the boat 217 in multiple stages. The heater 207 heats the wafers 200 loaded into the process chamber 201 to a predetermined temperature.

A gas pipe 10 as a gas pipe configured to supply a first processing gas (precursor gas) and a gas pipe 11 configured to supply a second processing gas (reaction gas) are in fluid communication with the process chamber 201. At the gas pipe 10, a gas supplier 4 configured to supply the precursor gas as the first processing gas, a flow rate controller (mass flow controller: MFC) 41 configured to control a flow rate of the precursor gas supplied from the gas supplier 4, and a valve 34 configured to open and close a flow path of the precursor gas are installed from the upstream side. From the gas pipe 10, the precursor gas is supplied into the process chamber 201 via the gas supplier 4, the MFC 41, the valve 34, and a nozzle 234 installed in the process chamber 201. A first processing gas supply system (also referred to as a precursor gas supply system) includes the gas pipe 10, the MFC 41, the valve 34, and the nozzle 234.

At the gas pipe 11, a gas supplier 5 configured to supply a reaction gas as a second processing gas, an MFC 32 configured to control a flow rate of the reaction gas supplied from the gas supplier 5, and a valve 35 configured to open and close a flow path of the reaction gas are installed from the upstream side. From the gas pipe 11, the reaction gas is supplied into the process chamber 201 via the gas supplier 5, the MFC 32, the valve 35, and a nozzle 233 installed in the process chamber 201. A second processing gas supply system (also referred to as a reaction gas supply system) includes the gas pipe 11, the MFC 32, the valve 35, and the nozzle 233.

A gas pipe heater 22 configured to heat the gas pipe 10 is installed around the gas pipe 10 from the gas supplier 4 to the process chamber 201. As the gas pipe heater 22 (hereinafter, also referred to as a first pipe heater), a tape heater which is a tape-shaped heater as a second heater according to the embodiments of the present disclosure is used.

A gas pipe 40 configured to supply an inert gas is connected to the gas pipe 10 on the downstream side of the valve 34 via a valve 39. A gas pipe heater 22 is also installed between the valve 39 of the gas pipe 40 and a connection point with the gas pipe 10. Further, a gas pipe 6 configured to supply an inert gas is connected to the gas pipe 11 on the downstream side of the valve 35 via a MFC 33 and a valve 36.

Although the gas pipe heater is not installed at the second processing gas supply system in the embodiments of the present disclosure, the gas pipe heater 22 according to the embodiments of the present disclosure may be appropriately installed depending on the second processing gas.

The process chamber 201 is connected to a vacuum pump 246 via an APC valve 243 by an exhaust pipe 231 as an exhaust side gas pipe configured to exhaust a gas. A gas exhaust system includes the exhaust pipe 231, the APC valve 243, and the vacuum pump 246. An exhaust pipe heater 20 (hereinafter, also referred to as a second pipe heater) as a third heater configured to heat the exhaust pipe 231 is installed around the exhaust pipe 231 from the reaction pipe 203 to the vacuum pump 246. A jacket-shaped heater including a molded heat insulating material is usually used as the exhaust pipe heater 20, and the above-mentioned tape heater is used as a thin pipe of a nominal diameter of ½ inch or less. Hereinafter, the exhaust pipe heater 20 and the gas pipe heater 22 may be collectively referred to as pipe heaters 310. Similarly, the gas pipes 6, 10, 11, 40 and 231 may be collectively referred to as gas pipes.

A nozzle 234 is installed to extend vertically from the lower portion to the upper portion of the reaction tube 203. The nozzle 234 is provided with a plurality of gas supply holes configured to distribute and supply the precursor gas. The gas supply holes are provided at positions between the wafers 200 facing each other via the inner tube 204 to distribute the processing gas to the wafers 200. The nozzle 233 is installed at a position spaced apart from the position of the nozzle 234 toward the inner circumference of the reaction tube 203 in the same manner as the nozzle 234. The nozzle 233 is also provided with a plurality of gas supply holes. The nozzle 234 is in fluid communication with the gas pipe 10 as described above, and distributes the precursor gas and the inert gas from the gas pipe 40 connected to the gas pipe 10 into the process chamber 201. Further, the nozzle 233 is in fluid communication with the gas pipe 11 as described above, and distributes the reaction gas and the inert gas from the gas pipe 6 connected to the gas pipe 11 into the process chamber 201. The processing gas is alternately supplied from the nozzles 234 and the nozzles 233 into the process chamber 201 to form a film.

A boat 217 where a plurality of wafers 200 are placed in multiple stages at the same intervals is installed in the inner tube 204. The boat 217 may be moved into and out of the process chamber 201 by a boat elevator. Further, a boat rotation mechanism 267 which is a rotator configured to rotate the boat 217 is installed, and the boat 217 held by the quartz cap 218 is rotated by rotating the boat rotation mechanism 267 to improve uniformity of processing.

(Functional Configuration of Controller 321)

Figure 2:
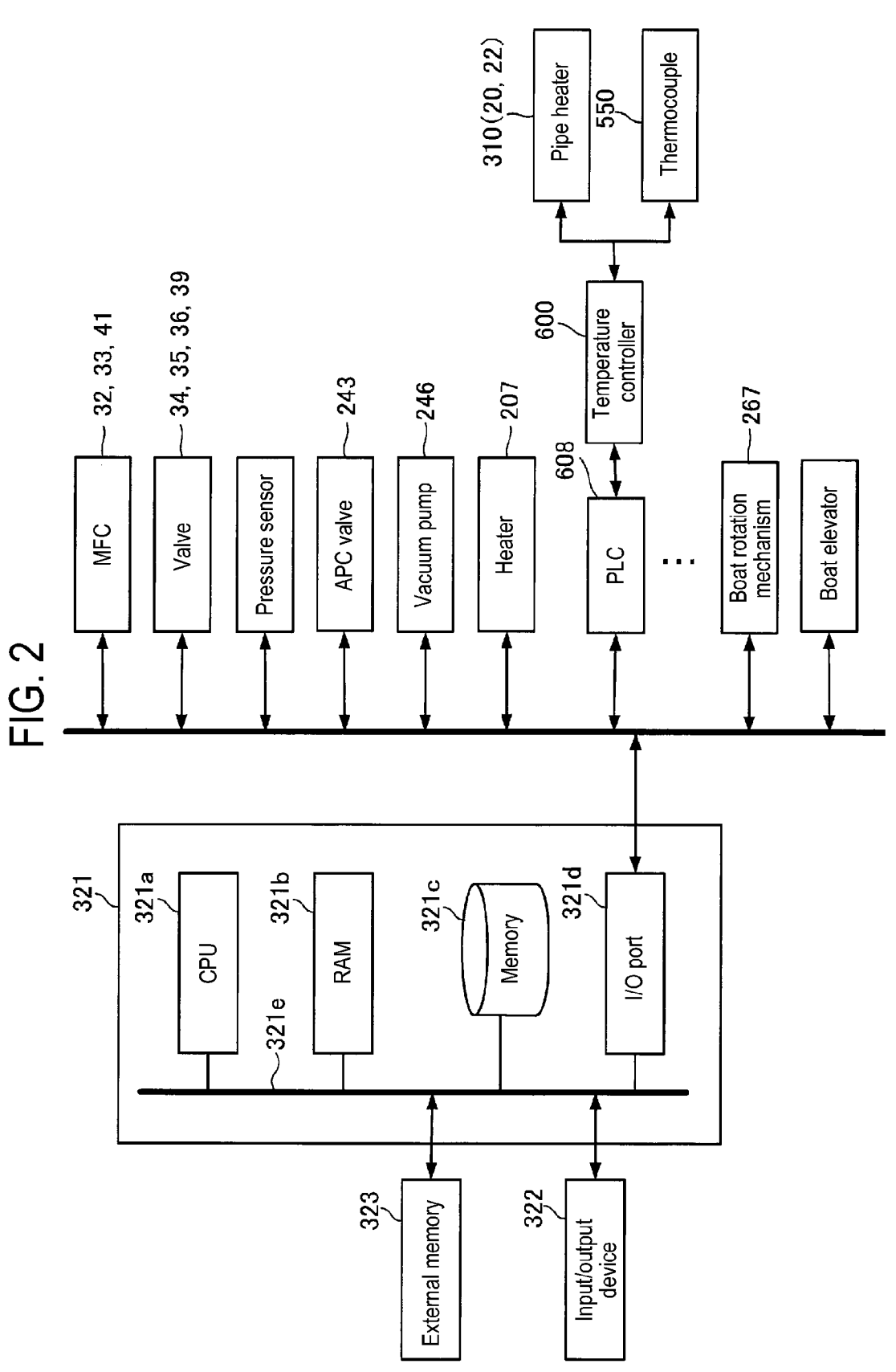
FIG. 2 is a diagram illustrating a functional configuration of a controller of a substrate processing apparatus according to embodiments of the present disclosure.

Next, the controller 321 as a controller will be described with reference to FIG. 2.

The controller 321 is configured as a computer including a CPU (Central Processing Unit) 321a, a RAM (Random Access Memory) 321b, a memory 321c, and an I/O port 321d. The RAM 321b, the memory 321c, and the I/O port 321d are configured to be capable of exchanging data with the CPU 321a via an internal bus 321e. An input/output device 322 configured as, for example, a touch panel or the like is connected to the controller 321.

The memory 321c includes, for example, a flash memory or the like. The memory 321c readably stores a control program that controls the operation of the substrate processing apparatus, a process recipe in which a procedure and a condition of substrate processing described later are written, and the like. The process recipe is configured to cause the controller 321 to execute each procedure in a substrate processing process including a substrate loading step S102 to a substrate unloading step S106, which will be described later, and obtain a predetermined result. In addition, the RAM 321b is configured as a memory area (work area) in which programs, data, and the like read by the CPU 321a are temporarily held.

The I/O port 321d is connected to the MFCs 32, 33 and 41, the valves 34, 35, 36 and 39, the pressure sensor, the APC valve 243, the vacuum pump 246, the thermocouple 550 as a temperature detector, the heater 207, the pipe heaters 310 (the gas pipe heater 22 and the exhaust pipe heater 20), the temperature controller 600, the programmable logic controller (PLC) 608, the boat rotation mechanism 267, the boat elevator, and the like.

The CPU 321a is configured to read a control program from the memory 321c and execute the same. Further, the CPU 321a is configured to read a process recipe from the memory 321c in response to input of an operation command from the input/output device 322 as an operation display, and the like. Then, the CPU 321a is configured to, according to contents of the process recipe thus read, control flow rate regulation operation of various gases by the MFC 32, 33, and 41, opening and closing operation of the valves 34, 35, 36, and 39, opening and closing operation of the APC valve 243, pressure regulation operation by the APC valve 243 based on pressure sensor, temperature regulation operation of the heater 207 based on the temperature sensor installed in each zone, temperature regulation operation of the pipe heaters 310 (each of the gas pipe heater 22 and the exhaust pipe heater 20) by the temperature controller 600 based on thermocouple 550, heating start and heating stop operation of the pipe heaters 310 by the temperature controller 600 based on the PLC 608, start and stop of the vacuum pump 246, rotation operation and rotation speed adjustment operation of the boat 217 by the boat rotation mechanism 267, elevation operation of the boat 217 by the boat elevator, and the like.

The controller 321 can be configured by installing the above-mentioned program stored in an external memory (e.g., a semiconductor memory such as a USB memory or a memory card) 323 into a computer. The memory 321c and the external memory 323 are configured as a computer-readable recording medium. Hereinafter, these are collectively and simply referred to as a recording medium. When the term recording medium is used in the present disclosure, it may include the memory 321c, the external memory 323, or both of them. The program may be provided to the computer by using a communication means or unit such as the Internet or a dedicated line without using the external memory 323.

(2) Substrate Processing Process

Figure 3:
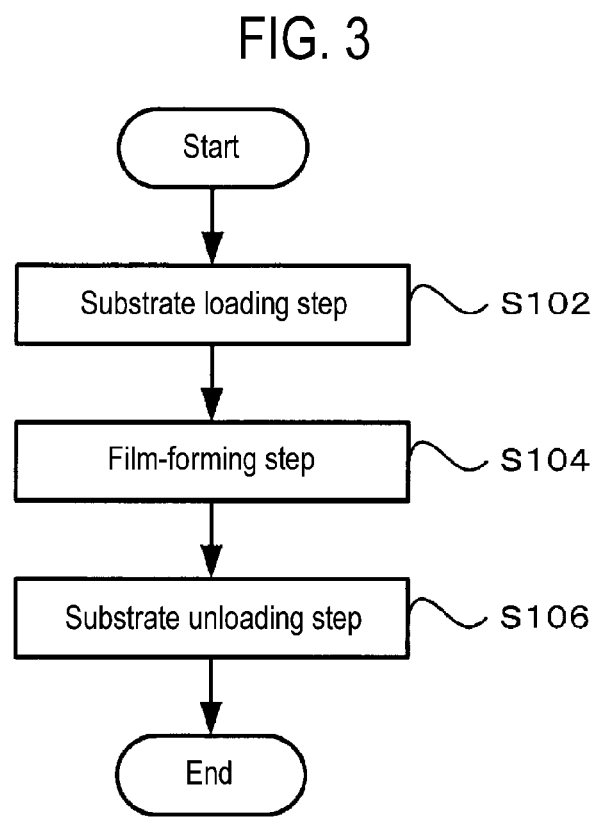

Next, outline of a substrate processing process of processing a substrate by using a substrate processing apparatus as a semiconductor manufacturing apparatus will be described with reference to FIG. 3. This substrate processing process is, for example, a process of manufacturing a semiconductor device. In the following description, operation and processing of each component constituting the substrate processing apparatus is controlled by the controller 321.

Now, an example in which a film is formed on a wafer 200 as a substrate by alternately supplying a first processing gas (precursor gas) and a second processing gas (reaction gas) to the wafer 200 will be described. Hereinafter, an example in which a SiN (silicon nitride) film as a thin film is formed on the wafer 200 by using a hexachlorodisilane ($Si_2Cl_6$, abbreviation: HCDS) gas as the precursor gas and using $NH_3$ (ammonia) as the reaction gas will be described. For example, a predetermined film may be formed in advance on the wafer 200, or a predetermined pattern may be formed in advance on the wafer 200 or a predetermined film.

(Substrate Loading Step S102)

First, a substrate loading step S102 is performed by charging the wafer 200 into the boat 217 and loading the boat 217 into the process chamber 201.

(Film-Forming Step S104)

Next, a film-forming step S104 of forming a thin film on the surface of the wafer 200 is performed. In the film-forming step, the following four steps are sequentially executed. During steps 1 to 4, the wafer 200 is heated to a predetermined temperature by the heater 207. Further, the gas pipe heater 22 heats parts of the gas pipe 10 and the gas pipe 40 to a first designated temperature. The first designated temperature is appropriately set according to the precursor gas. In the embodiments of the present disclosure, the $Si_2Cl_6$ gas is used as the precursor gas. Therefore, during the film-forming step S104, the parts of the gas pipe 10 and the gas pipe 40 are heated to, for example, 180 degrees C. or higher as the first designated temperature. Further, the exhaust pipe heater 20 heats the exhaust pipe 231 to a second designated temperature during the film-forming step S104. The second designated temperature is appropriately set to a temperature, for example, 100 degrees C. or higher, at which reaction product (by-product) generated by the precursor gas and the reaction gas may be suppressed from adhering to an inner surface of the exhaust pipe 231.

[Step 1]

In step 1, the $Si_2Cl_6$ gas is allowed to flow. First, the valve 34 installed at the gas pipe 10 and the APC valve 243 installed at the exhaust pipe 231 are both opened such that the $Si_2Cl_6$ gas whose flow rate is regulated by the MFC 41 is supplied from the gas supplier 4 to the gas pipe 10 and is exhausted from the exhaust pipe 231 while being supplied from the gas supply holes of the nozzle 234 into the process chamber 201. At this time, the gas pipe heater 22 heats the gas pipe 10, and the exhaust pipe heater 20 heats the exhaust pipe 231 to a predetermined temperature. Further, at this time, the pressure in the process chamber 201 is kept at a predetermined pressure. As a result, a silicon (Si) thin film is formed on the surface of the wafer 200.

[Step 2]

In step 2, the valve 34 of the gas pipe 10 is closed to stop the supply of the $Si_2Cl_6$ gas. The APC valve 243 of the exhaust pipe 231 is left opened, the process chamber 201 is evacuated by the vacuum pump 246, and residual gas is discharged from the process chamber 201. Further, the valve 39 installed at the gas pipe 40 is opened, the inert gas such as $N_2$ or the like is supplied from the gas pipe 40 to the process chamber 201 to purge the process chamber 201, and the residual gas in the process chamber 201 is discharged to the outside of the process chamber 201. Further, the valve 36 installed at the gas pipe 6 is opened, and the inert gas such as $N_2$ or the like whose flow rate is regulated by the MFC 33 is also supplied from the gas pipe 6 to the process chamber 201.

[Step 3]

In step 3, a $NH_3$ gas is allowed to flow. Both the valve 35 installed at the pipe 11 and the APC valve 243 installed at the exhaust pipe 231 are opened, and the $NH_3$ gas whose flow rate is regulated by the MFC 32 is supplied from the gas supplier 5 to the gas pipe 11 and is exhausted from the exhaust pipe 231 while being supplied from the gas supply holes of the nozzle 233 to the process chamber 201. Further, the pressure in the process chamber 201 is regulated to a predetermined pressure. By supplying the $NH_3$ gas, the Si thin film formed on the surface of the wafer 200 by the $Si_2Cl_6$ gas makes surface-reaction with the $NH_3$ gas to form a SiN film on the wafer 200.

[Step 4]

In step 4, the process chamber 201 is purged with the inert gas again. The valve 35 of the gas pipe 11 is closed to stop the supply of the $NH_3$ gas. The APC valve 243 of the exhaust pipe 231 is left opened, the process chamber 201 is evacuated by the vacuum pump 246 to remove the residual gas from the process chamber 201. Further, the valve 36 installed at the gas pipe 6 is opened, and the inert gas such as $N_2$ or the like whose flow rate is regulated by the MFC 33 is supplied from the gas pipe 6 to the process chamber 201 to purge the process chamber 201. In addition, the valve 39 installed at the gas pipe 40 is opened, and the inert gas such as $N_2$ or the like is also supplied from the gas pipe 40 to the process chamber 201.

By performing a cycle including steps 1 to 4 a plurality of times, a SiN film of a predetermined film thickness is formed on the wafer 200.

(Substrate Unloading Step S106)

Next, the boat 217 on which the wafer 200 where the SiN film is formed is mounted is unloaded from the process chamber 201.

According to the embodiments of the present disclosure, the precursor ($Si_2Cl_6$) gas is supplied from the gas pipe 10 to the process chamber 201 in a state where the gas pipe 10 is heated by at least the gas pipe heater 22. Therefore, it is possible to suppress liquefaction of the precursor gas and to prevent a gas containing particles from being supplied to the process chamber 201. In other words, as the temperature rises, saturated vapor pressure rises, which makes it possible to increase the pressure and the amount at which the gas may be supplied without causing liquefaction. It is desirable that the gas pipe 10 is heated at a uniform temperature from the upstream side to the downstream side or with a temperature distribution that gradually increases toward the downstream side. The temperature non-uniformity may cause a situation in which the gas pipe 10 is lower in temperature than the precursor gas. As a result, there is a risk of liquefaction. When the gas pipe 10 or the gas pipe 40 is long, the gas pipe heater 22 may be divided into a plurality of portions.

In the embodiments of the present disclosure, while the cycle including steps 1 to 4 is performed a plurality of times, at least the exhaust pipe heater 20 heats the exhaust pipe 231 and the gas pipe heater 22 continues to heat the gas pipe 10 and the gas pipe 40 to maintain the first and second designated temperatures. Further, in the embodiments of the present disclosure, during execution of the process recipe (from the substrate loading step S102 to the substrate unloading step S106), the temperature may be controlled while the exhaust pipe heater 20 heats the exhaust pipe 231, or the temperature may be controlled while heating at least one selected from the group of the gas pipe 10 and the exhaust pipe 231.

(3) Configuration of Pipe Heater 310

Next, the details of the pipe heater 310 according to the embodiments of the present disclosure will be described.

Figures 4A, 4B, 4C, 4D:
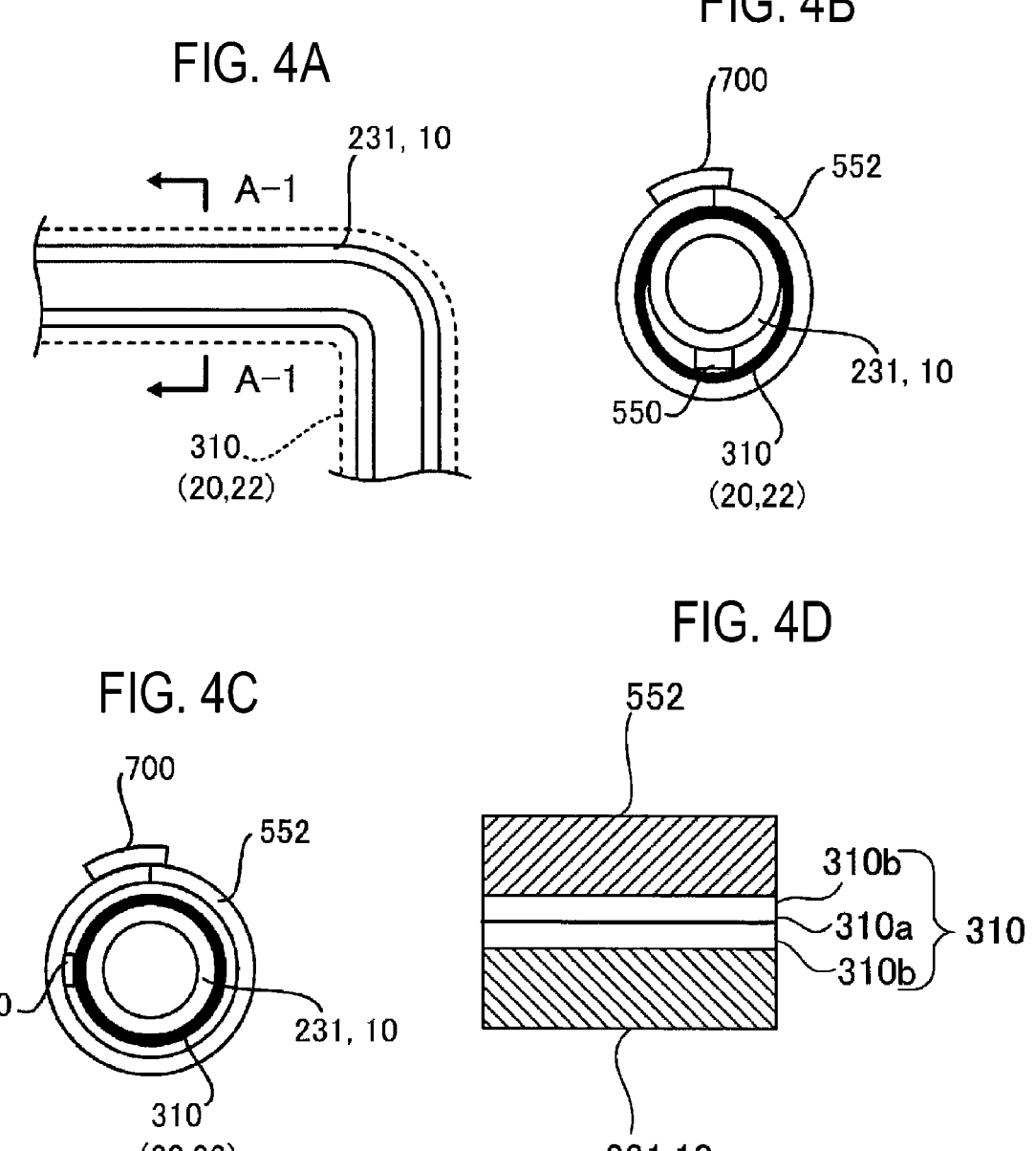
FIG. 4A is an enlarged view of a portion indicated by A in FIG. 1.
FIG. 4B is a cross-sectional view taken along a line A-1 in FIG. 4A.
FIG. 4C is a view showing a modification of the cross-sectional view taken along the line A-1 in FIG. 4A.
FIG. 4D is a partially-enlarged view for explaining a configuration of a pipe heater according to embodiments of the present disclosure.

The pipe heater 310 is, for example, a tape-shaped tape heater. As shown in FIGS. 4B and 4C, the pipe heater 310 is used by being wound around the pipe such as the exhaust pipe 231 or the gas pipe 10 made of a metallic material such as SUS or the like. A width of the pipe heater 310 is substantially equal to or slightly shorter than an outer circumference of the gas pipe 10 and may be wound by aligning a longitudinal direction of the pipe heater 310 with an extension direction of the pipe. Alternatively, the pipe heater 310 may be spirally wound around the relatively thick exhaust pipe 231. The former winding method tends to achieve high adhesion to a pipe of a large straight-line proportion.

The pipe heater 310 is formed in a structure where a wire is insulated without using a fibrous insulator. For example, as shown in FIG. 4D, the pipe heater 310 is formed in a structure in which a heating element film 310a as a heating element is sandwiched between polytetrafluoroethylene (PTFE) sheets 310b which is made of a fluorocarbon resin that is excellent in heat resistance. When the heating temperature is 200 degrees C. or lower, a structure in which a meandering heater wire is sandwiched between silicone rubbers may also be used. Even in a case where glass wool is kneaded into silicone rubber, the silicon rubber may be used without problems as long as it does not generate dust.

The outer peripheral side of the pipe heater 310 is covered and surrounded by a heat insulating material 552. On one end side of the heat insulating material 552, there is installed a fastener 700 that fastens one end side and the other end side of the heat insulating material 552 in a state in which one end side and the other end side of the heat insulating material 552 are adjacent to each other or in a state in which the heat insulating material 552 is wound around the pipe heater 310 for one turn or more. The pipe heater 310 made of PTFE undergoes plastic deformation, but elastic deformation remains in the pipe heater 310 under a normal construction condition. Therefore, it is desirable to always press the pipe heater 310 from the outer circumference thereof or pull both winding ends of the pipe heater 310 to improve the adhesion of the pipe heater 310 to the gas pipe 10 or the like.

FIG. 4B is a cross-sectional view showing a state in which a thermocouple 550 is installed inside the pipe heater 310, and FIG. 4C is a cross-sectional view showing a state in which a thermocouple 550 is installed outside the pipe heater 310.

As shown in FIGS. 4B and 4C, a thermocouple 550 as a temperature detector configured to detect the temperature of the pipe such as the exhaust pipe 231 or the gas pipe 10 is mounted inside the pipe heater 310 or outside the pipe heater 310. The thermocouple 550 is configured to be separable from the pipe heater 310, and is configured to detect the temperature of the exhaust pipe 231 or the gas pipe 10. The thermocouple 550 is mounted to be thermally coupled to the exhaust pipe 231 or the gas pipe 10 by coming into contact with the exhaust pipe 231 or the gas pipe 10. Further, one thermocouple 550 is installed to correspond to the pipe heater 310. That is, one thermocouple 550 is attached to each of the exhaust pipe heater 20 and the gas pipe heater 22. When there is a plurality of exhaust pipe heaters 20, a plurality of thermocouples 550 is also provided correspondingly.

Then, the controller 321 regulates a manipulated variable (output value) indicating the electric power outputted to each pipe heater 310 based on the temperature (actual measurement value) detected by each thermocouple 550 of the exhaust pipe 231 or the gas pipe 10, and controls the temperature (actual measurement value) of the exhaust pipe 231 or the gas pipe 10 to follow each predetermined set value.

In the case where the thermocouple 550 is separated from the pipe heater 310 as described above, the thermocouple 550 may be removed from the pipe heater 310 when the pipe heater 310 is mounted on the exhaust pipe 231 or the gas pipe 10. Further, even when the thermocouple 550 is mounted on the inner circumference, the thermocouple 550 may not be installed on the pipe heater 310. In addition, the correspondence between the pipe heater 310 and the thermocouple 550 may be erroneous. In a case where the temperature control is continued in such a state, the electric power may be continuously supplied to the pipe heater 310 at an output of 100%, and the pipe heater 310 may be overheated.

Further, as shown in FIGS. 4B and 4C, the thermocouple 550 is mounted inside the pipe heater 310 or inside the heat insulating material 552. Therefore, when the pipe heater 310 is attached or detached during maintenance of the substrate processing apparatus, even in a case where attachment of the thermocouple 550 is omitted or the thermocouple 550 is misaligned, this situation may not be visually recognized from the outside. For example, when the pipe heater 310 is rewound after pipe replacement or cleaning work, even in a case where a position of the thermocouple 550 is changed, a change in the measured temperature value (actual temperature) in the pipe may not be directly confirmed. Therefore, the detected temperature of the thermocouple 550 may be treated as the measured temperature value in the pipe.

Since the measured temperature value is controlled to follow the set temperature, the temperature detected by the thermocouple 550 is controlled to follow the set temperature. Therefore, the thermocouple 550 detects the temperature controlled even when the thermocouple 550 is misaligned. Accordingly, in a case where the measured temperature value is monitored, the thermocouple 550 may detect an ambient temperature when the thermocouple 550 is separated from the pipe heater 310. Therefore, even when the temperature inside the gas pipe reaches the set temperature, the controller 321 may determine that the set temperature is not reached, and may continue to supply the electric power to the pipe heater 310 with an output (manipulated variable) of 100%.

The present disclosers found that it is possible to prevent the pipe heater 310 from overheating and protect the pipe heater 310 and surrounding components from burning or the like to solve the above-mentioned problems by detecting an abnormality when the thermocouple 550 was separated from the pipe heater 310, attachment of the thermocouple 550 was omitted, or the like and automatically turning off the power supply to the pipe heater 310.

Figure 5:
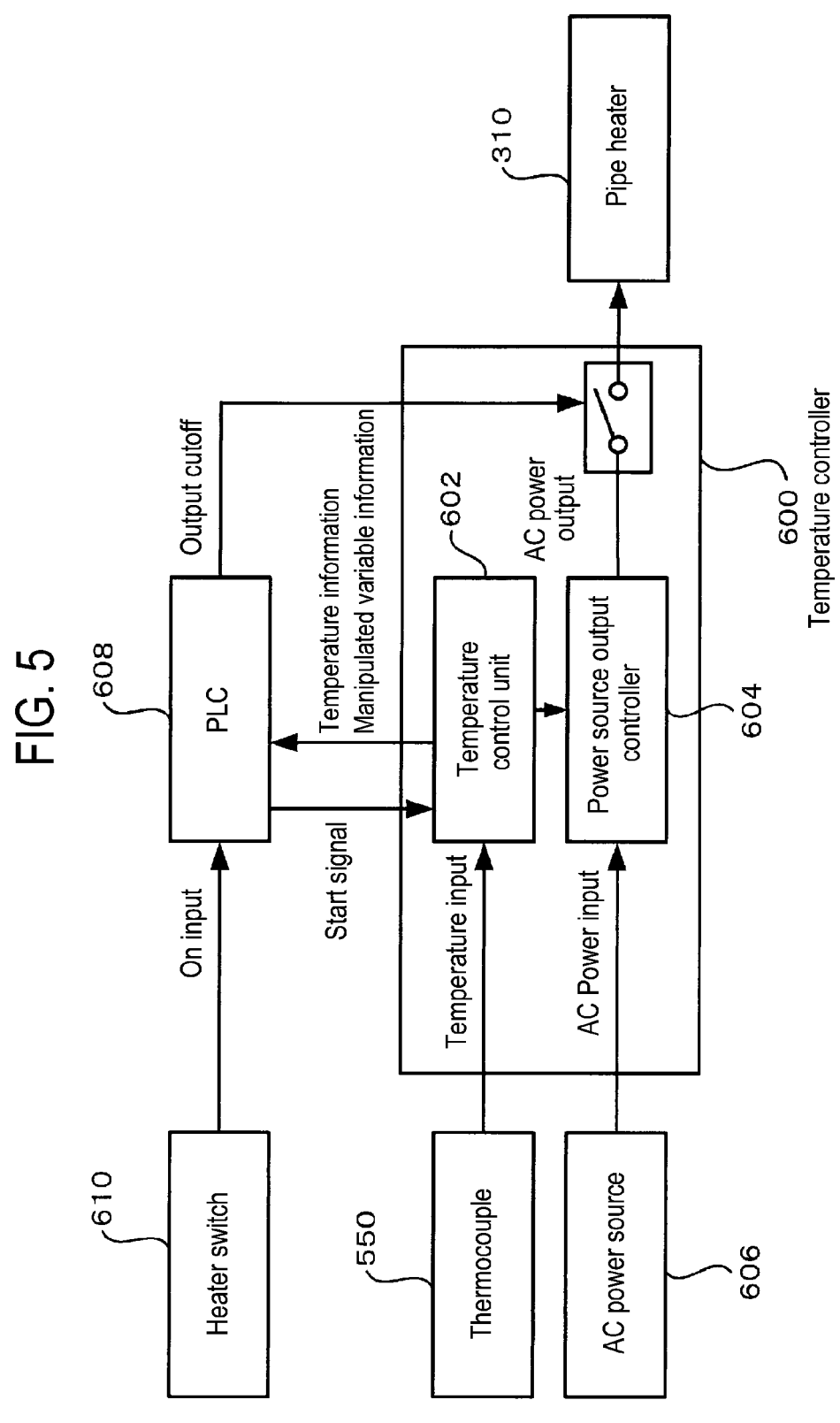
FIG. 5 is a diagram for explaining a configuration of a temperature controller according to embodiments of the present disclosure.

FIG. 5 is a block diagram explaining a configuration of the temperature controller 600 used in the embodiments of the present disclosure.

The temperature controller 600 includes at least a temperature control unit 602 and a power source output controller 604 as a power source output controller.

The measured temperature detected by the thermocouple 550 is inputted to the temperature control unit 602. Then, the temperature control unit 602 performs PID (Proportional-Integral-Differential) control with respect to a deviation between the measured temperature detected by the thermocouple 550 and the stored set temperature (target temperature) of the pipe heater 310, and generates a manipulated variable indicating the electrical power to be supplied to the pipe heater 310. Then, the temperature control unit 602 automatically controls the power source output controller 604 such that the deviation between the measured temperature and the set temperature disappears.

An AC power source 606 is connected to the power source output controller 604. The power source output controller 604 regulates the input AC power according to the manipulated variable from the temperature control unit 602 and outputs the regulated AC power to the pipe heater 310. As the power source output controller 604, for example, a semiconductor relay (solid state relay: SSR) serially inserted into a circuit including the AC power source 606 and the pipe heater 310 may be used.

As an example, the temperature control unit 602 outputs a manipulated variable which is a continuous amount, and the power source output controller 604 generates a binary signal of a duty ratio proportional to the manipulated variable to on-off control the semiconductor relay. Such control is called cycle control or time division proportional control. The binary signal may be generated in the temperature controller 600. Alternatively, the power source output controller 604 may include a thyristor and may control the thyristor by generating a trigger signal, which gives a conduction angle corresponding to the manipulated variable, in synchronization with the AC power. Such control is called phase control.

The temperature controller 600 is communicatively connected to a PLC (Programmable Logical Controller) 608 as a host controller by RS-485 or the like. The PLC 608 is also communicatively connected to the controller 321.

A heater switch 610 is connected to the PLC 608. The PLC 608 controls start and stop of heating of the exhaust pipe 231 or the gas pipe 10 under the control of the temperature controller 600. The heater switch 610 may be a physical switch or a logical switch whose state may be changed by the controller 321.

The PLC 608 transmits a control start signal to the temperature controller 600 by activating the heater switch 610. Then, the PLC 608 acquires temperature information, which is the measured temperature obtained by the thermocouple 550, and manipulated variable information on the manipulated variable, which indicates the electric power to be given to the pipe heater 310, from the temperature controller 600. In addition, the PLC 608 monitors whether the temperature of the pipe heater 310 is significantly deviated from the desired setpoint (target value).

Then, after the start of heating of the exhaust pipe 231 or the gas pipe 10 under the control of the temperature controller 600, the PLC 608 repeatedly acquires the manipulated variable information indicating the electric power to be supplied to the pipe heater 310. Then, the PLC 608 integrates the time duration during which the acquired manipulated variable is 100%, which is the maximum value, and controls the temperature controller 600 to stop the heating of the exhaust pipe 231 or the gas pipe 10 when the integrated time duration exceeds a threshold value.

Further, after the start of heating of the exhaust pipe 231 or the gas pipe 10 under the control of the temperature controller 600, the PLC 608 repeatedly acquires the temperature information which is the temperature detected by the thermocouple 550, and integrates the time duration during which the manipulated variable is 100% which is the maximum value and the deviation of the temperature detected by the thermocouple 550 from the temperature at the start of heating of the exhaust pipe 231 or the gas pipe 10 is less than a predetermined threshold value. Then, when the integrated time duration exceeds the threshold value, the PLC 608 controls the temperature controller 600 to stop the heating of the exhaust pipe 231 or the gas pipe 10.

For example, the power source output controller 604 forcibly turns off the binary signal and the trigger signal in response to a cutoff signal received from the PLC 608. This is achieved by using a logical product of the generated binary signal or trigger signal and the cutoff signal. Alternatively, separately from the SSR or the like used in the temperature control, a SSR controlled by the cutoff signal may be serially inserted into the circuit. As a result, the power supply to the pipe heater 310 is turned off regardless of the manipulated variable received from the temperature control unit 602.

A plurality of sets of the pipe heater 310, the thermocouple 550, and the temperature controller 600 may be installed. The set is also called a channel. In that case, one cut-off means or unit such as an electromagnetic relay or the like installed on the side of the AC power source 606 may be commonly used for a plurality of pipe heaters 310. Then, the PLC 608 may set a desired setpoint for each temperature controller 600. When the heating of the gas pipe 310 is stopped under the control of at least one temperature controller 600, the PLC 608 may stop the control by allowing the power source output controller 604 to turn off the power supply to the pipe heaters 310.

Next, the operation of the PLC 608 will be described with reference to FIG. 6. While an ON signal is inputted by the heater switch 610, the PLC 608 performs the following processing according to a ladder program held therein.

In step S10, the PLC 608 transmits a control start signal to the temperature controller 600 when the ON signal is inputted by the heater switch 610.

When the control start signal is transmitted from the PLC 608 in step S12, the power output to the pipe heater 310 is started by the power source output controller 604, and the exhaust pipe 231 and the gas pipe 10 are heated.

In step S14, the PLC 608 acquires the measured temperature detected by the thermocouple 550 as temperature information from the temperature controller 600.

In step S16, the PLC 608 waits until a preset time elapses. Alternatively, the processing after step S18 may not be performed. After the lapse of the waiting time, in step S18, the PLC 608 determines whether or not the temperature deviation between the measured temperature (initial temperature) at the control start time in step S10 and the measured temperature after the lapse of the set time is equal to or greater than a threshold value. That is, the PLC 608 determines whether or not the deviation of the measured temperature detected by the thermocouple 550 from the temperature at the start of heating of the exhaust pipe 231 or the gas pipe 10 is less than the predetermined threshold value. As the waiting time, it may be possible to use a time duration (e.g., 1 minute) which is sufficient for the temperature detected by the normal thermocouple 550 to change due to the heating by the pipe heater 310.

In a case where it is determined in step S18 that the temperature deviation is equal to or greater than the threshold value (Yes in step S18), the power supply by the power source output controller 604 is continued in step S20, and the process returns to step S18 to continue to monitor the temperature control by the temperature controller 600.

In a case where it is determined in step S18 that the temperature deviation is less than the threshold value (No in step S18), the PLC 608 determines whether or not the state in which the manipulated variable by the power source output controller 604 is 100% continues for a threshold time duration or longer in step S22. To this end, step S22 may include a sub-step S22a of determining whether the manipulated variable in the acquired manipulated variable information is 100% and updating (incrementing) the integrated time duration if the manipulated variable is 100%, and a sub-step S22b of comparing the integrated time duration with the threshold time duration. When the thermocouple 550 is removed, the manipulated variable will saturate to the maximum value after the waiting time elapses. Therefore, based on the estimation that the manipulated variable is 100%, the determination may be omitted and the integrated time duration may be updated. In that case, the determination as to whether the manipulated variable is 100% may be made once when the integrated time duration becomes equal to or longer than the threshold time duration.

Then, in step S22, when it is determined that the manipulated variable is 100% (maximum value) and the threshold time duration or more elapsed (Yes in step S22), the power source is cut off by the power source output controller 604 in step S24. That is, the temperature controller 600 is controlled to stop the heating of the exhaust pipe 231 or the gas pipe 10, thereby cutting off the supply of electric power to the pipe heater 310. At this time, an overheat prevention alarm may be generated to indicate that the supply of electric power is cut off In a case where it is determined in step S22 that the manipulated variable is 100% (maximum value) and the threshold time duration or more does not elapse (No in step S22), the process returns to step S18 to continue the temperature control by the temperature controller 600.

That is, in a case where the deviation between the temperature at the moment when the heater switch 610 is pressed and the temperature measured after pressing the heater switch 610 is equal to or greater than the threshold value, the power output to the pipe heater 310 is continued, and the temperature control is continued as it is. Then, in a case where the deviation between the temperature at the moment when the heater switch 610 is pressed and the temperature measured after pressing the heater switch 610 is less than the threshold value, and the integrated time duration obtained by integrating the time duration during which the output value information is 100% (maximum value) is equal to or more than a threshold value, the power output to the pipe heater 310 is cut off. Even in a case where the thermocouple 550 is removed during temperature control, the process may be branched from step S18 to step S22 to finally cut off the power output.

In addition to the operation shown in FIG. 6, the PLC 608 may monitor the manipulated variable (output value) to the pipe heater 310 and the temperature measured by the thermocouple 550, and may detect an event capable of affecting an actual temperature in the pipe and generate an alarm. In a case where the correspondence between the pipe heater 310 and the thermocouple 550 is incorrect, there may appear a pair of channels of the temperature controller 600 where the measured temperature is higher than a target temperature by a prescribed value or more in one channel and is lower than the target temperature by the prescribed value or more in the other channel, or a pair of channels of the temperature controller 600 where the manipulated variable is a maximum value in one channel and is a minimum value in the other channel. Therefore, when the channels are detected after a stabilization time longer than the waiting time from the operation of the heater switch 610 elapses, an alarm including information that specifies the pertinent channel may be generated, or a stop signal may be sent to the temperature controller 600 of the channel in which the manipulated variable is kept at the maximum value. This operation is effective for detection of a construction defect of the thermocouple even when it is performed during a trial run period after starting the apparatus. Meanwhile, even in a case where an abnormality is not detected within the trial run period and a possibility of the construction defect is excluded, there may also exist an abnormality detected thereafter. For example, in a case where overheating of the pipe heater 310 is detected despite the manipulated variable being 0% (minimum value), it may be determined that the thyristor (SCR) is abnormal (short-circuit mode failure). In a case where an excessively low temperature of the pipe heater 310 is detected after a stabilization time elapses from the operation of the heater switch 610, it may be determined that the pipe heater 310 is disconnected or the SCR is abnormal (open mode failure). Then, when it is determined that the abnormality occurred, the power supply to the target pipe heater 310 installed in the substrate processing apparatus is stopped. That is, it is possible to suppress the overheating of the pipe heater 310.

According to the embodiments of the present disclosure, it is possible to detect an abnormality in the temperature change of the gas pipe 10. Therefore, by performing a restoration process such as rewinding of the pipe heater 310 or the like, for example, the liquefaction of the processing gas due to a temperature drop in the gas pipe 10 is suppressed, and the gas is not accumulated in the furnace opening. Therefore, an influence on the film thickness may be suppressed, and deterioration of a processing quality of the substrate may be suppressed.

According to the embodiments of the present disclosure, it is possible to detect an abnormality in the temperature change of the exhaust pipe 231. Therefore, by performing a restoration process such as rewinding of the pipe heater 310 or the like, for example, the adhesion of by-products to the exhaust pipe 231 due to the temperature drop of the exhaust pipe 231 may be suppressed. As a result, a cleaning cycle may be lengthened.

In the above-described embodiments of the present disclosure, the examples in which the tape heater is used as the pipe heater 310 are described. However, the present disclosure is not limited thereto, and may also be suitably applied to a case where a pipe heater removably attached to a pipe, such as a jacket heater, a combination of a jacket heater and a tape heater, a combination of an aluminum block and a jacket heater, a rubber heater, or the like is used.

Further, in the above-described embodiments of the present disclosure, the example of the process of forming the SiN film on the wafer 200 is described. However, the present disclosure is not limited thereto, and may also be suitably applied to a case where a film is formed, modified, or etched by using the pipe heater 310.

Further, in the above-described embodiments of the present disclosure, the example in which the film is formed by using the substrate processing apparatus which is a batch type vertical apparatus configured to process a plurality of substrates at one time is described. However, the present disclosure is not limited thereto, and may also be suitably applied to a case where a film is formed by using a single-substrate type substrate processing apparatus that processes one or several substrates at one time.

While various typical embodiments of the present disclosure are described above, the present disclosure is not limited to those embodiments and may be used in combination as appropriate.

(4) Example

Figure 7A:
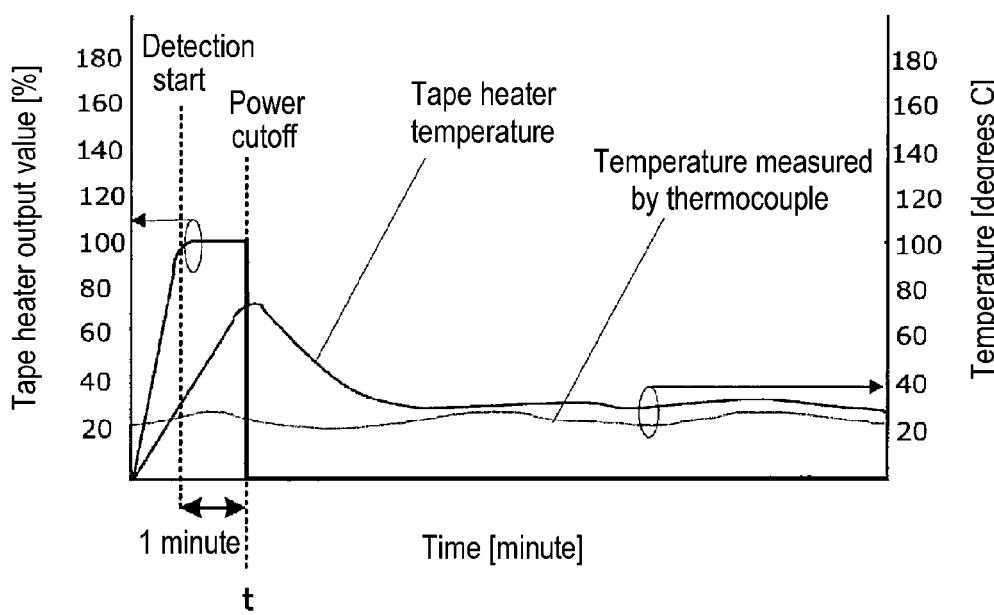
FIG. 7A is a diagram showing changes in an output value of a tape heater, a temperature of the tape heater, and a temperature measured by a thermocouple over time in the embodiments of the present disclosure.
Figure 7B:
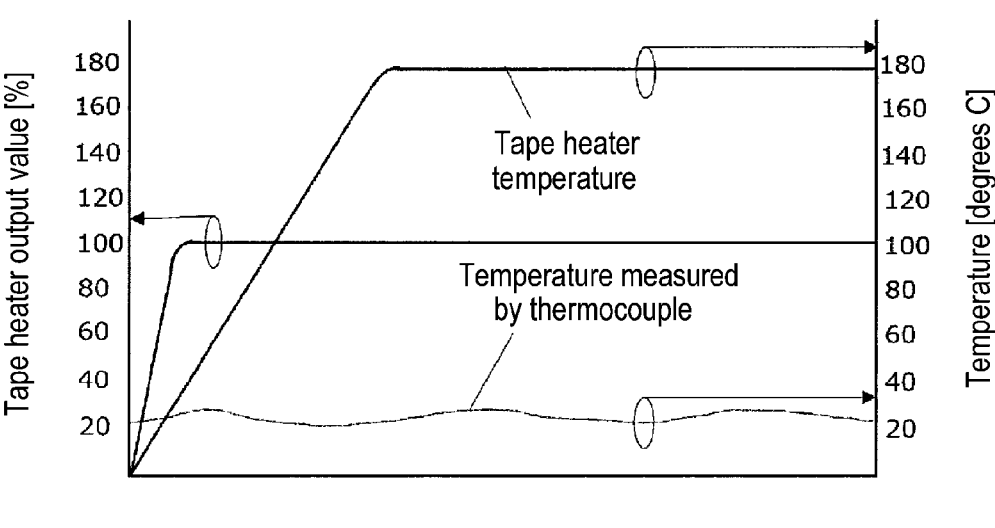
FIG. 7B is a diagram showing changes in an output value of a tape heater, a temperature of the tape heater, and a temperature measured by a thermocouple over time in a comparative example.

FIGS. 7A and 7B are diagrams showing the changes in the output value (manipulated variable) of the tape heater, the temperature of the tape heater, and the temperature measured by the thermocouple 550 over time in the case where the thermocouple 550 is removed from the tape heater which is an example of the pipe heater 310. Right vertical axis in each of FIGS. 7A and 7B shows a temperature increase amount (a difference between a current temperature and an initial temperature).

As shown in FIG. 7B, in the comparative example where a substrate processing apparatus not including the PLC 608 and the temperature controller 600 is used, in a case where the thermocouple is removed from the tape heater when the gas pipe is heated to 180 degrees C., the temperature control of the tape heater is continued while the thermocouple is removed, such that the temperature of the gas pipe is not reflected in the tape heater, and the tape heater continues to be supplied with electric power at an output value (manipulated variable) of 100%, thereby raising the temperature of the tape heater to 180 degrees C. Therefore, the tape heater comes into an abnormal heat generation state.

On the other hand, in the example in which the substrate processing apparatus according to the embodiments of the present disclosure is used, as shown in FIG. 7A, in a case where the thermocouple is removed from the tape heater when the gas pipe is heated to 180 degrees C., the heater switch is turned on, and then the PLC 608 acquires the temperature (temperature information) measured by the thermocouple and the manipulated variable (manipulated variable information) to the tape heater from the temperature controller 600. Then, in a case where the temperature deviation between the temperature measured by the thermocouple at the moment of pressing the heater switch and the temperature measured by the thermocouple at 1 minute after pressing the heater switch is 2 degrees C. or less and the manipulated variable of the tape heater continues to be 100% (maximum value) for 1 minute or more, the PLC 608 determines that the position or state of the thermocouple is abnormal, and cuts off the electric power supplied to the tape heater at time t.

That is, when the thermocouple attached to the tape heater is removed, the PLC 608 detects the abnormality of the tape heater and cuts off the electric power supplied to the tape heater. This makes it possible to prevent abnormal heating or overheating of the pipe heater. The maximum value of the manipulated variable used by the temperature controller 600 is not limited to 100% at which the power source output controller 604 is constantly turned on, and may be set to any value between 0 and 100%.

According to the present disclosure, it is possible to suppress overheating of a pipe heater.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a plurality of pipe heaters configured to heat at least one gas pipe configured to supply a gas to a process chamber in which a substrate is processed;
   a plurality of temperature detectors configured to detect a temperature of the at least one gas pipe;
   a plurality of temperature controllers configured to be capable of, based on a temperature detected by the plurality of temperature detectors, outputting a manipulated variable indicating electric power to be supplied to the plurality of pipe heaters, and controlling the temperature of the at least one gas pipe to approach at least one desired setpoint;

a host controller configured to be capable of controlling start and stop of heating of the at least one gas pipe performed under the control of the plurality of temperature controllers; and a power source output controller configured to turn on and off a supply of the electric power to the plurality of pipe heaters under the control of the host controller, wherein the host controller is configured to be capable of, after a predetermined waiting time elapses from the start of heating of the at least one gas pipe performed under the control of the plurality of temperature controllers, acquiring the manipulated variable, integrating a time duration during which the manipulated variable is kept at a maximum value, and controlling the plurality of temperature controllers to stop heating the at least one gas pipe when the integrated time duration becomes equal to or more than a threshold value, wherein a plurality of sets, each of which includes at least one of the plurality of pipe heaters, at least one of the plurality of temperature detectors, and at least one of the plurality of temperature controllers, are installed in the substrate processing apparatus, and wherein the each of the plurality of temperature controllers controls an electric power output from the power source output controller by conduction angle control or on/off control such that electric power according to the manipulated variable is supplied to a corresponding pipe heater of the plurality of pipe heaters.

2. The substrate processing apparatus of claim 1, wherein after the predetermined waiting time elapses, the host controller repeatedly acquires the temperature detected, integrates the time duration during which the manipulated variable is kept at the maximum value and a deviation between the temperature detected and a temperature at the start of heating of the at least one gas pipe is less than a predetermined threshold value, and controls the plurality of temperature controllers to stop heating the at least one gas pipe when the integrated time duration becomes equal to or more than the threshold value.

3. The substrate processing apparatus of claim 2, wherein the host controller does not perform the integration during the predetermined waiting time.

4. The substrate processing apparatus of claim 2, wherein each of the plurality of pipe heaters is a tape heater including a wire insulated without using a fibrous insulator.

5. The substrate processing apparatus of claim 2, wherein each of the plurality of temperature detectors is attached to be thermally coupled to the at least one gas pipe by coming into contact with the at least one gas pipe such that each of the plurality of temperature detectors is installed to correspond to each of the plurality of pipe heaters in a one-to-one relationship with each other.

6. The substrate processing apparatus of claim 3, wherein each of the plurality of temperature detectors is attached to be thermally coupled to the at least one gas pipe by coming into contact with the at least one gas pipe such that each of the plurality of temperature detectors is installed to correspond to each of the plurality of pipe heaters in a one-to-one relationship with each other.

7. The substrate processing apparatus of claim 2, further comprising:

a power source output controller configured to turn on and off the supply of the electric power to the plurality of pipe heaters under the control of the host controller, wherein the at least one desired setpoint includes a plurality of desired setpoints, and wherein the host controller sets the at least one desired setpoint with respect to each of the plurality of temperature controllers respectively and stops the control by turning off the supply of electric power to an entirety of the plurality of pipe heaters by the power source output controller when the heating of the at least one gas pipe is stopped under the control of at least one selected from the plurality of temperature controllers.

8. The substrate processing apparatus of claim 7, wherein the power source output controller includes a thyristor or semiconductor relay serially inserted into a circuit including an AC power source and the plurality of pipe heaters.

9. The substrate processing apparatus of claim 1, wherein the plurality of temperature detectors are configured to be separable from the plurality of pipe heaters.

10. The substrate processing apparatus of claim 1, wherein the at least one desired setpoint includes a plurality of desired setpoints, and wherein the host controller is further configured to be capable of, after a stabilization time longer than the waiting time elapses, acquiring the temperature detected by the plurality of temperature detectors each correspondingly connected to each of the plurality of temperature controllers in each of the plurality of sets, and generating a construction defect alarm when detecting at least one selected from the group of:

a pair of a set in which the temperature detected is higher than a corresponding desired setpoint of the plurality of desired setpoints by a prescribed value or more and a set in which the temperature detected is lower than the corresponding desired setpoint by the prescribed value or more, or a pair of a set in which the manipulated variable is the maximum value and a set in which the manipulated variable is a minimum value.

11. The substrate processing apparatus of claim 10, wherein when the temperature detected indicates overheating after the at least one selected from the group of the pairs is not detected, the host controller determines that at least one of the plurality of temperature controllers undergoes a short-circuit mode failure, and when the temperature detected is excessively lower than the corresponding desired setpoint, the host controller determines that the at least one of the plurality of temperature controllers undergoes an open mode failure.

12. The substrate processing apparatus of claim 1, wherein a width of at least one of the plurality of pipe heaters corresponds to an outer circumference of the at least one gas pipe and is installed such that a longitudinal direction of the at least one of the plurality of pipe heaters extends along the at least one gas pipe.

13. The substrate processing apparatus of claim 8, wherein a width of at least one of the plurality of pipe heaters corresponds to an outer circumference of the at least one gas pipe and is installed such that a longitudinal direction of the at least one of the plurality of pipe heaters extends along the at least one gas pipe.

14. The substrate processing apparatus of claim 1, wherein each of the plurality of pipe heaters is formed in a structure in which a heating element film is sandwiched between heat-resistant resin sheets.

15. A method of manufacturing a semiconductor device, comprising:

processing a substrate in a process chamber;

heating at least one gas pipe configured to supply a gas to the process chamber by a plurality of pipe heaters;

detecting a temperature of the at least one gas pipe by a plurality of temperature detectors;

outputting a manipulated variable indicating electric power to be supplied to the plurality of pipe heaters based on a detected temperature and controlling the temperature of the at least one gas pipe to approach at least one desired setpoint, by a plurality of temperature controllers; and after start of heating of the at least one gas pipe, acquiring the manipulated variable, integrating a time duration during which the manipulated variable is kept at a maximum value, and stopping the heating of the at least one gas pipe when the integrated time duration becomes equal to or more than a threshold value, by a host controller;

turning on and off the supply of the electric power to the plurality of pipe heaters under the control of the host controller, by a power source output controller, wherein a plurality of sets, each of which includes at least one of the plurality of pipe heaters, at least one of the plurality of temperature detectors, and at least one of the plurality of temperature controllers, are installed in the substrate processing apparatus, and wherein the each of the plurality of temperature controllers controls an electric power output from the power source output controller by conduction angle control or on/off control such that electric power according to the manipulated variable is supplied to a corresponding pipe heater of the plurality of pipe heaters.

16. A method of processing a substrate, comprising:

processing the substrate in a process chamber;

heating at least one gas pipe configured to supply a gas to the process chamber by a plurality of pipe heaters;

detecting a temperature of the at least one gas pipe by a plurality of temperature detectors;

outputting a manipulated variable indicating electric power to be supplied to the plurality of pipe heaters based on a detected temperature and controlling the temperature of the at least one gas pipe to approach at least one desired setpoint, by a plurality of temperature controllers; and after start of heating of the at least one gas pipe, acquiring the manipulated variable, integrating a time duration during which the manipulated variable is kept at a maximum value, and stopping the heating of the at least one gas pipe when the integrated time duration becomes equal to or more than a threshold value, by a host controller;

turning on and off the supply of the electric power to the plurality of pipe heaters under the control of the host controller, by a power source output controller, wherein a plurality of sets, each of which includes at least one of the plurality of pipe heaters, at least one of the plurality of temperature detectors, and at least one of the plurality of temperature controllers, are installed in the substrate processing apparatus, and wherein the each of the plurality of temperature controllers controls an electric power output from the power source output controller by conduction angle control or on/off control such that electric power according to the manipulated variable is supplied to a corresponding pipe heater of the plurality of pipe heaters.

* * * * *